(12) United States Patent
Summers

(10) Patent No.: US 9,859,904 B1
(45) Date of Patent: Jan. 2, 2018

(54) INTERPOLATING FEEDBACK DIVIDER

(71) Applicant: Cadence Design Systems, Inc., San Jose, CA (US)

(72) Inventor: Mark Alan Summers, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/278,521

(22) Filed: Sep. 28, 2016

(51) Int. Cl.
*H03K 21/00* (2006.01)
*H03L 7/197* (2006.01)
*H03L 7/099* (2006.01)
*H03L 7/089* (2006.01)

(52) U.S. Cl.
CPC .......... *H03L 7/1974* (2013.01); *H03L 7/0891* (2013.01); *H03L 7/099* (2013.01)

(58) Field of Classification Search
CPC ...... H03K 23/667; H03K 23/68; H03K 23/54; H03K 23/44; G06F 7/68; H03B 19/14; H03B 19/12; H03B 21/12; H03L 7/1974; H03L 7/0891; H03L 7/099
See application file for complete search history.

(56) References Cited

U.S. PATENT DOCUMENTS

| 6,933,761 | B2* | 8/2005 | Chang | H03K 5/13 327/231 |
| 2003/0198311 | A1* | 10/2003 | Song | H03C 3/0925 375/376 |
| 2004/0257137 | A1* | 12/2004 | Chang | H03K 5/13 327/233 |
| 2015/0263742 | A1* | 9/2015 | McLaurin | H03L 7/085 327/158 |

* cited by examiner

*Primary Examiner* — Long Nguyen
(74) *Attorney, Agent, or Firm* — Andrews Kurth Kenyon LLP (57) ABSTRACT

Systems and methods disclosed herein provide for a fractional feedback divider with reduced jitter at the output without increasing the input clock frequency and with minimal power increase. Embodiments of the system provide for interpolating, with a multiplexer, different output clock signals depending on whether an extra half period of resolution from the input clock is needed for a certain output clock cycle.

16 Claims, 6 Drawing Sheets

| Iter | DIV<N1> | DIV<0> | sum | carry | DIV_adj<N1> | DIV_adj<N+> | DIV_adj<0> | Tot |
|---|---|---|---|---|---|---|---|---|
| 1 | 10 | 0.5 | 0.5 | 0 | 10 | | 0.5 | 10.5 |
| 2 | 10 | 0.5 | 0 | 1 | 11 | | 0.0 | 21 |
| 3 | 10 | 0.5 | 0.5 | 0 | 10 | | 0.5 | 31.5 |
| 4 | 10 | 0.5 | 0 | 1 | 11 | | 0.0 | 42 |
| 5 | 10 | 0.5 | 0.5 | 0 | 10 | | 0.5 | 52.5 |
| 6 | 10 | 0.5 | 0 | 1 | 11 | | 0.0 | 63 |
| 7 | 10 | 0.5 | 0.5 | 0 | 10 | | 0.5 | 73.5 |

INTERPOLATING FEEDBACK DIVIDER

TECHNICAL FIELD

The present application relates to systems and methods of reducing jitter associated with fractional feedback dividers during fractional-N phase locked loop (PLL) synthesis.

BACKGROUND

Fractional feedback dividers are utilized in fractional-N PLL synthesis in order to generate clock out signals that are non-integer (i.e., fractional) multiples of the reference clock inputs, thereby increasing the range of synthesized frequencies. Contrary to integer-N PLL synthesis, in which the generated clock out signal can only be integer (i.e., N) multiples of the reference clock inputs, the fractional feedback dividers are able to dynamically modulate the feedback divider ratio between N and N+1 such that the averaged divide ratio, over time, is a fractional number between N and N+1. Therefore, the period of the output clock of the fractional feedback divider will modulate, e.g., in the simplest case, between two different values (i.e., N and N+1). Unfortunately, the modulation in divide ratios also results in jitter (also known as "phase noise" in the frequency domain) at the output clock. Jitter occurs when the output clock is off its ideal position. For example, if the output clock should ideally be at a value between "10" and "11," jitter will result if the output clock is off that position and is instead at either "10" or "11." This is due to the fact that the positive edges (i.e., integer values) and negative edges (i.e., fractional values) of the output clock can only line up with the positive edge (i.e., integer values) of the input clock. As such, the output clock will be associated with the wrong frequency when the period of the clock cycle is either "10" or "11." Specifically, the output clock would be considered too fast when the divide ratio is "10" and too slow when the divide ratio is "11." Jitter results in error elsewhere as well. For example, in a serial link, jitter increases the likelihood of sampling error during data recovery. Specifically, instead of sampling a signal when intended, it is sampled either too early or too late. The sampled value will therefore not be the intended value, thus resulting in error.

Current solutions address the jitter problem at the output clock of the fractional feedback divider by running the input clock frequency at twice the speed (since jitter is indirectly proportional to the fractional feedback divider input clock frequency). Therefore, by increasing the input clock frequency by a factor of two, the output clock is able to land on twice as many positive edges of the input clock, resulting in a corresponding reduction (i.e., 2×) of the jitter in the output clock. However, increasing the input clock frequency requires a corresponding increase in the power being supplied to the fractional feedback divider (since the input clock frequency is directly proportional to the power being supplied). Further, at the twice the previous input clock frequency, many of the paths (e.g., combinational logic paths) associated with the fractional feedback divider would need to meet timing, which is more difficult at twice the speed.

Accordingly, there is a need for an improved method and apparatus for reducing jitter at the output of the fractional feedback divider without increasing the input clock frequency and with minimal power increase.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide methods and apparatuses for reducing jitter at the output of the fractional feedback divider without increasing the input clock frequency and with minimal power increase. The methods and apparatuses herein address at least one of the problems discussed above.

According to an embodiment, a fractional feedback divider circuit includes: a programmable feedback divider, the programmable feedback divider configured to receive a divide code value and an input clock signal, and generate a divided clock based on the divide code value and the input clock signal; first and second delay elements, wherein: the first delay element is configured to receive the divided clock and generate a first output clock signal, the second delay element is configured to receive the first output clock signal and generate a second output clock signal, the first delay element is clocked at a positive edge of the input clock signal and the second delay element is clocked at a negative edge of the input clock signal; and a multiplexer, the multiplexer having: a first multiplexer input configured to receive the first output clock signal, a second multiplexer input configured to receive the second output clock signal, and a third multiplexer input configured to receive a selector signal, wherein, based on the selector signal, the multiplexer outputs one of the first and second output clock signals.

According to an embodiment, a method for a fractional feedback divider circuit includes: receiving, at a programmable feedback divider, a divide code value and an input clock signal; generating, with the programmable feedback divider, a divided clock based on the divide code value and the input clock signal; receiving, at a first delay element, the divided clock, wherein the first delay element is clocked at a positive edge of the input clock signal; generating, with the first delay element, a first output clock signal; receiving, at a second delay element, the first output clock signal, wherein the second delay element is clocked at a negative edge of the input clock signal; generating, with the second delay element, a second output clock signal; receiving, at first, second and third multiplexer inputs of a multiplexer, the first output clock signal, the second output clock signal, and a selector signal, respectively; and outputting, based on the selector signal, one of the first and second output clock signals.

Figure 1A:
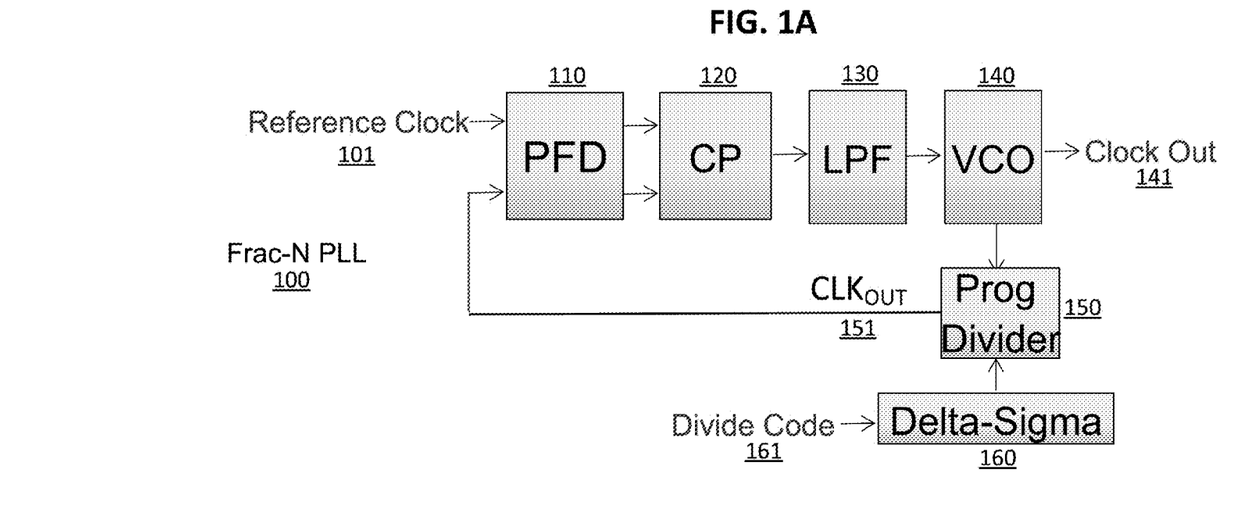
FIG. 1A is a block diagram of an architecture utilized during fractional-N PLL synthesis.

FIG. 1A is a block diagram of an architecture utilized during fractional-N PLL synthesis. As depicted in FIG. 1A, the fractional-N PLL synthesis architecture 100 ("frac-N PLL") includes a phase frequency detector ("PFD") 110, a charge pump ("CP") 120, loop filter ("LPF") 130, voltage controlled oscillator ("VCO") 140, a programmable fractional feedback divider ("programmable divider") 150, and a delta-sigma modulator 160. The PFD 110 receives two inputs, a reference clock 101 and a programmable divider clock $CLK_{OUT}$ 151. The PFD 110 compares the phases and frequencies of the reference clock 101 and the programmable divider clock $CLK_{OUT}$ 151. The PFD 101 generates and transmits the phase and frequency differences between clocks 101 and 151 to the CP 120. Based on the polarity of the measured phase and frequency differences, the CP 120 activates either the pump-up or pump-down current source in the charge pump in order to correct the phase and frequency differences. If the pump-up current source is activated, more charge will be transferred to the LPF 130. If the pump-down current source (i.e., current sink) is activated, some charge will be taken away from the LPF 130. The amount of charge in either the pump-up or pump-down scenario is proportional to the magnitude of the phase and frequency differences. The LPF 130 filters and integrates the output current from the CP 120 in order to smooth out the variation in the control voltage of the VCO 140. Therefore, depending on whether the pump-up or the pump-down current source was activated, the LPF 130 adjusts the control voltage of the VCO 140 so that (i) its phase either moves forward or moves back to correct a phase difference and/or (ii) the VCO 140 speeds up or slows down to correct a frequency difference. The VCO 140 also generates an output signal, i.e., clock out 141, whose frequency is proportional to the input voltage from the LPF 130. Clock out 141 is a non-integer multiple of the reference clock 101. The programmable divider 150 divides the clock generated by the VCO 140, i.e., clock 141, by a divide ratio in order to generate a clock, i.e., $CLK_{OUT}$ 151, which matches the frequency of the reference clock 101. Therefore, as a result of the programmable divider 150, the output frequency of clock 141 is equivalent to the frequency of the reference clock 101 multiplied by the divide ratio. The divide ratio of the programmable divider 150 is driven by the delta-sigma modulator 160. The delta-sigma modulator 160 encodes the divide ratio that is sent to the programmable divider 150 based on a received divide code 161. The divide code 161, which corresponds to a desired divide ratio, may be a plurality of bits associated with integer and fractional values. Further, the divide code 161 may be set by either a programmer or a computer processor. The delta-sigma modulator 160 receives the divide code 161, which could be associated with both integer and fractional values, and outputs a divide code 162 (e.g., DIV<N:1>) representing an integer value that, over time, matches the divide code 161 on average. In other words, the output divide code 162 modulates such that the average value, over time, is correct. For example, if the desired divide ratio is 10.5, the output divide code will alternate between values of 10 and 11 such that the average value, over time, is 10.5 (e.g., for one cycle, the delta-sigma modulator 160 outputs a "10," and for the next cycle, it will output an "11"). Further, like the divide code 161, the output divide code 162 may also be represented by a plurality of bits. For example, the output divide code 162, i.e., DIV<N:1>, may include N bits.

Figure 1B:
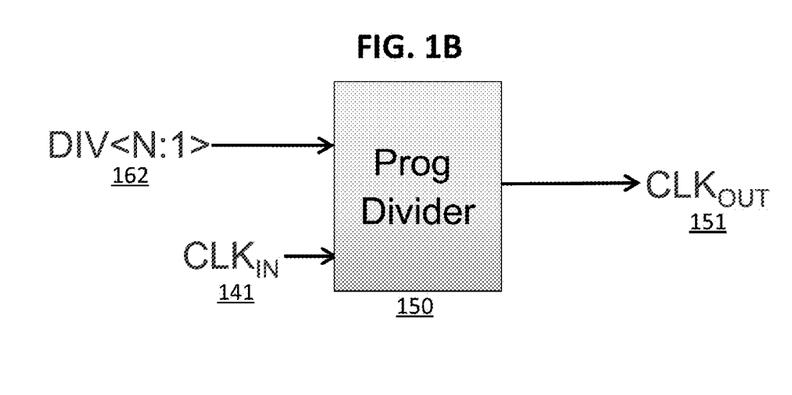
FIG. 1B is a block diagram of the fractional feedback divider utilized in FIG. 1A.

FIG. 1B is a block diagram of the fractional feedback divider utilized in FIG. 1A. As depicted in FIG. 1B, the programmable divider 150 generates a programmable divider clock $CLK_{OUT}$ 151 based on the divide code 162 (i.e., DIV<N:1>) and the input clock $CLK_{IN}$ 141 (which is equivalent to the output clock 141, i.e., Clock Out). Specifically, the programmable divider 150 generates a programmable divider clock 151 that includes a frequency that is equivalent to the frequency of the clock 141 divided by the divide code 162. Further, the divide code 162 can be updated once per each clock cycle of the clock 151. Therefore, the divide code 162 can vary after every clock cycle. This variation in the divide code can be used to generate frequencies at the clock 151 that are in between the integer values of the divide code. For example, the following sequence of the divide codes gives an average value of 10.5: 10, 11, 10, 11 . . . 10, 11. Similarly, for 10.25, it would be 10, 10, 10, 11, 10, 10, 10, 11 . . . 10, 10, 10, 11. Therefore, any pattern can be used to generate arbitrary frequencies. However, as discussed above, the changing divide codes 162 also result in jitter at the clock 151. Specifically, as depicted in the 10.5 pattern, at each clock cycle, the frequency of the clock 151 is running at the wrong frequency. For example, the frequency is too fast (i.e., by a half input clock cycle) when the divide code is 10 and is too slow (i.e., by a half input clock cycle) when the divide code is 11.

Figure 2A:
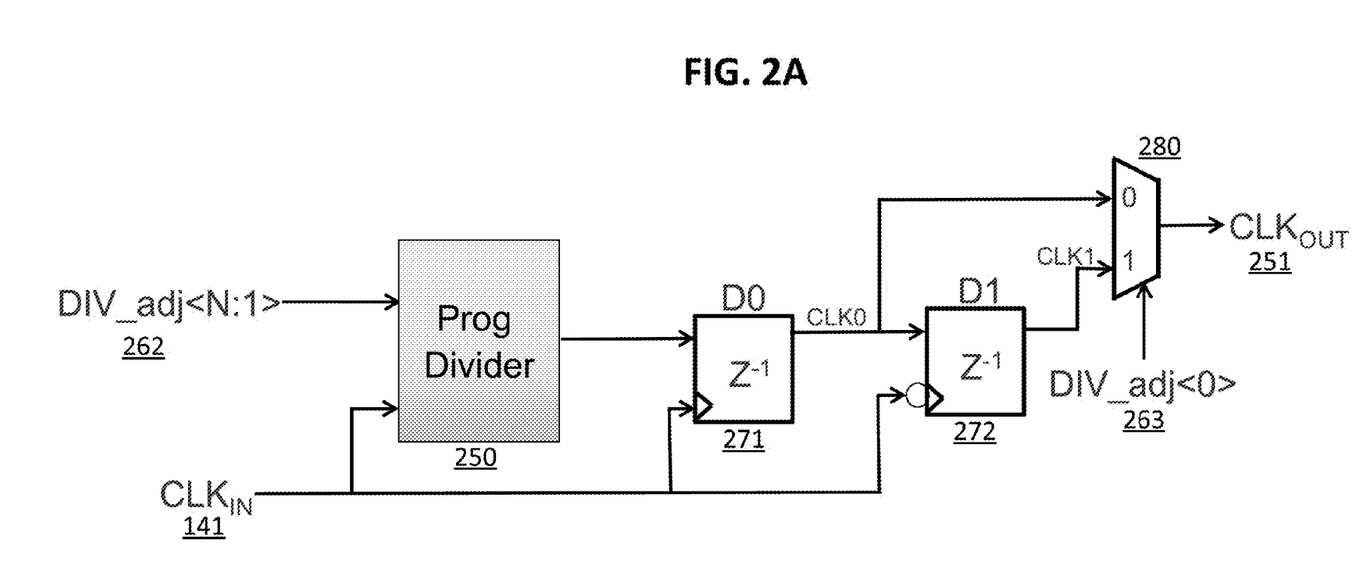
FIG. 2A is a block diagram a fractional feedback divider according to an embodiment of the present invention.

FIG. 2A is a block diagram a fractional feedback divider according to an embodiment of the present invention. As depicted in FIG. 2A, in addition to programmable divider 250, the architecture also includes delay elements 271 (i.e., D0) and 272 (i.e., D1), multiplexer ("mux") 280, and adjusted divide code bits 262 (i.e., DIV_adj<N:1>) and 263 (DIV_adj<0>). In an embodiment, divide code bits 262 correspond to an integer value (e.g., N or N+1) and divide code bit 263 corresponds to a fractional value of "0.5" (i.e., 0.5 period of the input clock 141). The control logic for generating divide code bits 262 and 263 will be discussed in further detail below. Similar to the programmable divider 150, the programmable divider 250 receives, as an input, the divide code bits 262 and is clocked with the clock 141. Further, in an embodiment, delay elements 271 and 272 are also clocked with the clock 141. In an embodiment, the delay elements 271 and 272 are flops. As further depicted in FIG. 2A, delay element 272 includes an inverter at its clock input. Therefore, unlike delay element 271, which will be clocked from the positive edge of the clock 141, delay element 272 will be clocked from the negative edge of the clock 141. In an embodiment, the delay element 271 receives, as an input, an output of the programmable divider 250. Further, the delay element 271 also generates an output signal CLK0. In an embodiment, delay element 272, receives, as an input, signal CLK0, and generates an output signal CLK1. Further, in an embodiment, because CLK0 is associated with the positive edge of the clock 141 and CLK1 is associated with the negative edge of clock 141, CLK1 will be delayed from CLK0 by half of a period of the input clock 141. In an embodiment, the mux 280 receives at a first input, the signal CLK0, and receives, at a second input, the signal CLK1. In an embodiment, the mux 280 also receives the divide code bit 263 at the selector input. Therefore, depending on the value of the divide code bit 263, the mux 280 will select one of the signals CLK0 and CLK1 to transmit as the output clock signal, $CLK_{OUT}$ 251. Specifically, if the divide code bit 263 is a logical "1," then the mux 280 will select signal CLK1 to transmit as the signal $CLK_{OUT}$ 251. However, if the divide code bit 263 is a logical "0," the mux 280 will instead select signal CLK0 to transmit as the signal $CLK_{OUT}$ 251. In an embodiment, the divide code bit 263 represents half of a period of the input clock 141. Therefore, if the divide code bit 263 is a logical "1," that means an extra half of a period of the input clock 141 is required by the programmable divider 250 for a certain clock cycle. Similarly, if the divide code bit 263 is a logical "0," that means the programmable divider 250 does not need the extra half of a period of the input clock 141 for that clock cycle. In an embodiment, with the addition of the second delay element 272, which is clocked from the negative edge of the input clock 141, and the mux 280, the resolution of the programmable divider 250 is increased by a factor of two. For example, instead of just landing on the positive edges of the input clock 141, the signal $CLK_{OUT}$ 251 can now also land on the negative edges of the input clock 141. Therefore, the programmable divider 250 can now achieve a resolution of 0.5 $CLK_{IN}$ (i.e., clock 141) frequency steps. This is similar to increasing the frequency of the input clock 141 of the programmable divider 150 by a factor of two. However, unlike the programmable divider 150, which requires doubling the power in order to achieve the increased frequency, the only power increase for the programmable divider 250 comes in the small increase required to clock the second delay element 272. Other than that, there is no other power cost. Therefore, the programmable divider 250 can achieve the same jitter reduction as increasing the frequency of the input clock 141 but with minimal power increase. Further, because there are no delay elements between delay elements 271 and 272, the timing path between delay element 271 and 272 will be short (i.e., only one path) and, therefore, the timing between these two clocks will be easier to meet.

Figure 2B:
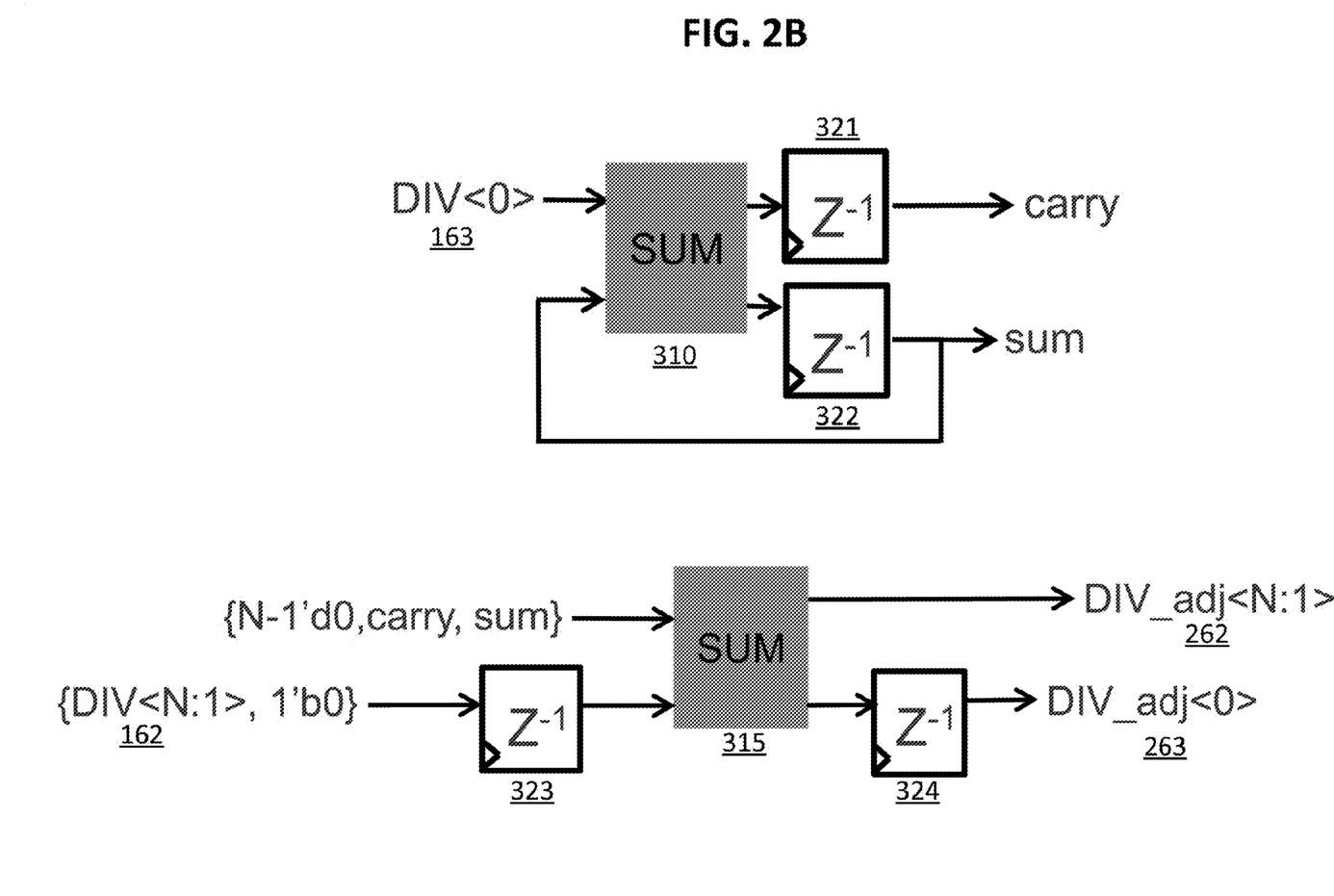
FIG. 2B is a block diagram of the logic utilized by the fractional feedback divider of FIG. 2A.

FIG. 2B is a block diagram of the logic utilized by the fractional feedback divider of FIG. 2A. The long term frequency of the programmable divider 250 is determined only by the divider section (i.e., divide code bit 262 and programmable divider 250) and not the combination of the mux 280 and the delay elements 271 and 272 (i.e., interpolation logic). As discussed above, the combination of the mux 280 and the delay elements 271 and 272 adds a delay of half of the period of clock 141 to the feedback when the divide code bit 263 is high (i.e., a logical "1"). This delay is only added to the output of the programmable divider 250. The delay, however, does not accumulate in the programmable divider 250, itself, nor does it change the frequency of the divided clock (i.e., output of the programmable divider 250). Therefore, in order to ensure that the long term frequency is correct, the frequency of the divide ratio (i.e., divide code bits 262 and 263) needs to be continuously updated. In an embodiment, the divide code bits could be updated once per each clock cycle of the clock 251. In an embodiment, the divide code bits 262 and 263 could be updated each clock cycle with certain control logic. FIG. 2B depicts an embodiment of the control logic that could be used to update the divide code bits 262 and 263. In an embodiment, a first part of the control logic includes a first summer 310 and flops 321 and 322. In an embodiment, the flops 321 and 322 are clocked at the clock 251 (i.e., $CLK_{OUT}$). In an embodiment, the first summer 310 receives, as inputs, divide code bit 163 and the previous value at flop 322. In an embodiment, divide code bit 163 corresponds to the zeroth bit of the divide code 161 (i.e., DIV<0>). In an embodiment, the zeroth bit, like the other bits of the divide code 162, is generated by the delta-sigma modulator 160. Further, the zeroth bit, i.e., the least significant bit, of the divide code 161 represents a divide value of "0.5." Similarly, "DIV<1>" corresponds to a divide value of "1," "DIV<2>" corresponds to a divide value of "2," "DIV<3>" corresponds to a divide value of "4," . . . and "DIV<N>" corresponds to a divide value of "$2^{N-1}$." Therefore, if the divide code 161 included a fraction (e.g., "0.5"), the divide code bit 163 will be a logical "1" (i.e., high). Otherwise, if the divide code 161 only corresponds to an integer value (i.e., no fractions), the divide code bit 163 will be a logical "0" (i.e., low). In an embodiment, the first summer 310 sums the value at the divide code bit 163 (i.e., "0.5" or "0") with the previous value at the flop 322 (i.e., "0.5" or "0") and outputs a corresponding carry and sum value to the flops 321 and 322, respectively. In an embodiment, if the first summer 310 sums two "0" values, the sum of the two values will be "0" and the carry will also be "0." Therefore, flops 321 and 322 will both be updated with a "0." If the first summer 310 sums two "0.5" values, the sum of the two values will be "0" and the carry will be "1." Lastly, if the first summer 310 sums a "0.5" and "0," the sum of the two values will be "0.5" and the carry will be "0." In an embodiment, once the flops 321 and 322 are updated with the carry and sum values, respectively, the control logic moves on to a second part. The second part of the control includes a second summer 315 and flops 323 and 324. In an embodiment, the flops 323 and 324 are also clocked at the clock 251 (i.e., $CLK_{OUT}$). In an embodiment, the flop 323 is first updated with the value of the divide code 162 (i.e., DIV<N:1>). Further, in an embodiment, the second summer, receives, at a first input, the sum and carry values from flops 322 and 321, and receives, at a second input, the value at the flop 323 (i.e., DIV<N:1>). In an embodiment, in order to align the bit length of the first input to the bit length of the second input before they are summed, (i) the sum value is placed at the least significant bit position of the first input, (ii) the carry value is placed at the second least significant bit position of the first input, and (iii) N–1 "0s" (i.e., N01'd0) are included in front of the carry and sum. Similarly, in the second input, a "0" bit is included at the least significant bit position (i.e., 1'b0), e.g., to the right of the least significant bit of DIV<N:1>. Therefore, when the first input is added to the second input, the sum at the least significant bit will always be equal to the value at the flop 322. In an embodiment, the summer 315 adds the first input to the second input and outputs the summed value of the N:1 bits to the divide code bits 262. Therefore, if the carry value is a "1," the value at the divide code bits 262 will increase by one; otherwise, the divide code bits 262 will be equal to the divide code 162. In an embodiment, the summer 315 also updates the flop 324 with the sum of the least significant bit at the first input and the least significant bit and the second input. In other words, the summer will update the flop 324 with value from flop 322 (i.e., since the least significant bit at the second input is "0"). The value at the flop 324 will then be utilized to update the divide code bit 263. For example, if the sum value at the flop 322 is "0.5," the flop 324 and, accordingly, the divide code bit 263 will be updated with a "0.5." Similarly, if the sum value at the flop 322 is "0," the flop 324 and the divide code bit 263 will be updated with a "0." In an embodiment, after the divide code bits 262 and 263 are updated in the second part of the control logic, the values at the divide code bits 262 and 263 are fed into the programmable divider 250 and the selector input at the mux 280, respectively. In an embodiment, the first and second parts of the control logic are performed once per clock cycle of the clock 251. Therefore, based on the updated divide code bits 262 and 263, the programmable divider 250 is able to output a clock 251 that can include the half period delay for one clock cycle and not include it in another clock cycle. In an embodiment, the first and second parts of the control logic are performed by a computer processor (not shown). Further, the computer processor also drives the divide code bits 262 and 263 to the programmable divider 250 and the mux 280, respectively.

Figure 2C:
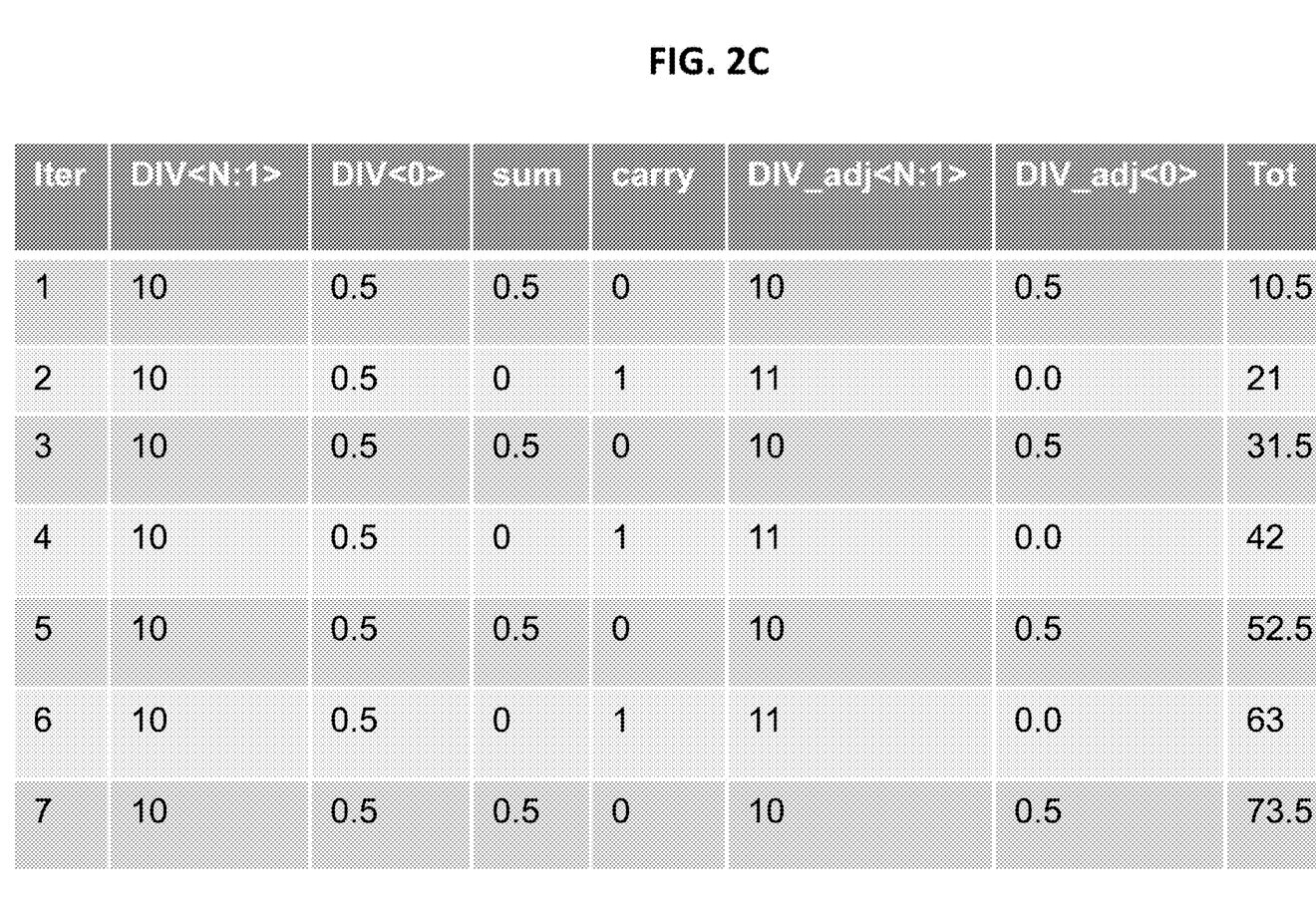
FIG. 2C is a table of values associated with the logic of FIG. 2B.

FIG. 2C is a table of values associated with the logic of FIG. 2B. In an embodiment, the table of FIG. 2C assumes that the divide code 161 corresponds to a value of "10.5." As such, the integer portion, i.e., divide code 162, will be "10" and the fractional portion, i.e., divide code 163, will be "0.5." Accordingly, for the first clock cycle, the summer 310 will receive, as inputs, "0.5" from the divide code bit 163 and "0" from the flop 322 (i.e., the flop 322 is preset with a value of "0" for the first clock cycle). Therefore, the flop 322, which corresponds to the sum, will be updated with a "0.5," and the flop 321, which corresponds to the carry, will be updated with a "0." Further, for the second part of the control logic, the summer 315 (i) sums the value at flop 321 (i.e., "0") to the value associated with the divide code 162 (i.e. "10") and outputs the summed value, "10," to the divide code bits 262 and (ii) updates the flop 324 (and, therefore, the divide code bit 263) with the sum value from the flop 322 (i.e., "0.5"). Therefore, for the first clock cycle, the programmable divider 250 will receive a value of "10" from the divide code bit 262 and the mux 280 will receive a value of "0.5" from the divide code bits 262. Accordingly, the programmable divider 250 will divide the input clock 141 by "10" and, because the divide code bit 263 is "0.5," the mux 280 will select CLK1 (i.e., the divided clock delayed by an extra half period of the input clock 141) as the $CLK_{OUT}$ 251. Therefore, the first clock cycle will have a total divide count of "10.5." For the following clock cycle, the summer 310 will receive, as inputs, "0.5" from the divide code bit 163 and "0.5" from the flop 322 (i.e., the value at the flop 322 after the first clock cycle). Therefore, the flop 322, which corresponds to the sum, will be updated with a "0," and the flop 321, which corresponds to the carry, will be updated with a "1." Further, for the second part of the control logic, the summer 315 (i) sums the value at flop 321 (i.e., "1") to the value associated with the divide code 162 (i.e. "10") and outputs the summed value, "11," to the divide code bits 262 and (ii) updates the flop 324 (and, therefore, the divide code bit 263) with the sum value from the flop 322 (i.e., "0"). Therefore, for the following clock cycle, the programmable divider 250 will receive a value of "11" from the divide code bits 262 and the mux 280 will receive a value of "0" from the divide code bits 262. Accordingly, the programmable divider 250 will divide the input clock 141 by "11" and, because the divide code bit 263 is "0," the mux 280 will select CLK0 (i.e., the divided clock not delayed by an extra half period of the input clock 141) as the $CLK_{OUT}$ 251. Therefore, the second clock cycle will have a total divide count of "21." As depicted in FIG. 2C, in the following clock cycles, (i) the divide code bits 262 will alternate between "10" and "11" and (ii) the divide code bit 263 will alternate between "0.5" and "0."

Figure 3A:
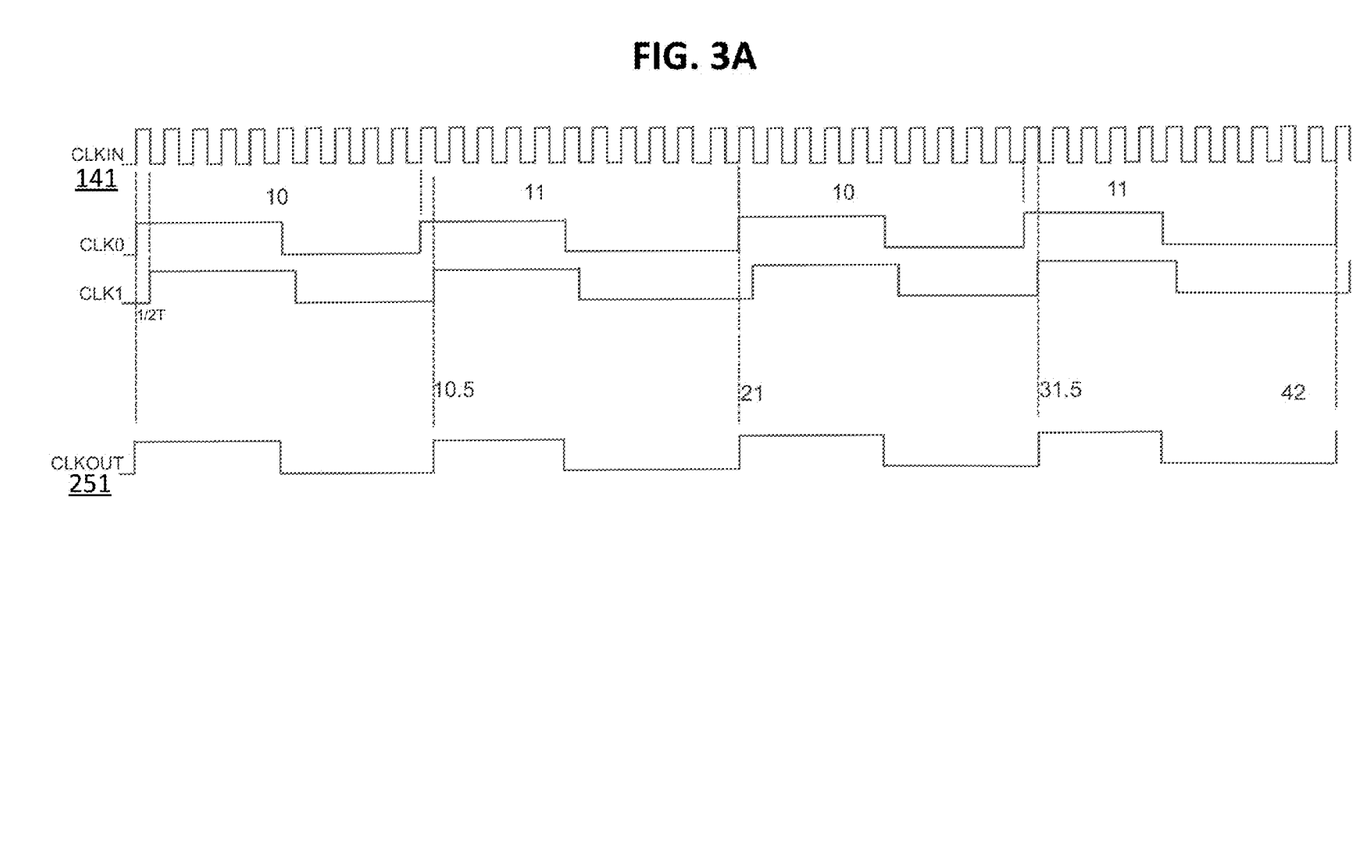
FIG. 3A is a timing diagram showing the operation of the fractional feedback divider of FIG. 2A.

FIG. 3A is a timing diagram showing the operation of the fractional feedback divider of FIG. 2A. Specifically, FIG. 3A depicts the timing diagram of the input clock 141, CLK0, CLK1, and the output clock 251 of the programmable divider 250 assuming a desired divide code of "10.5." As depicted in the figure, CLK0 begins on the positive edge of the input clock 141 and CLK1 beings on the negative edge of the input clock 141. Further, both of CLK0 and CLK1 have the same period for each of the clock cycles of the output clock 251 (i.e., either "10" or "11"). Further, as depicted in the figure, CLK1 is delayed by a half of a period of the input clock 141 from CLK0. In an embodiment, for the first clock cycle of the output clock 251, CLK1 is selected in order to achieve the desired divide code for that clock cycle, e.g., "10.5." Similarly, for the second cycle of the output clock 251, CLK0 is selected in order to reach the desired divide code for that clock cycle, e.g., "21." Likewise, for the third and fourth cycles, CLK1 and CLK0 are selected, respectively, in order to reach the desired divided code for the corresponding clock cycle, i.e., "31.5" and "42."

Figure 3B:
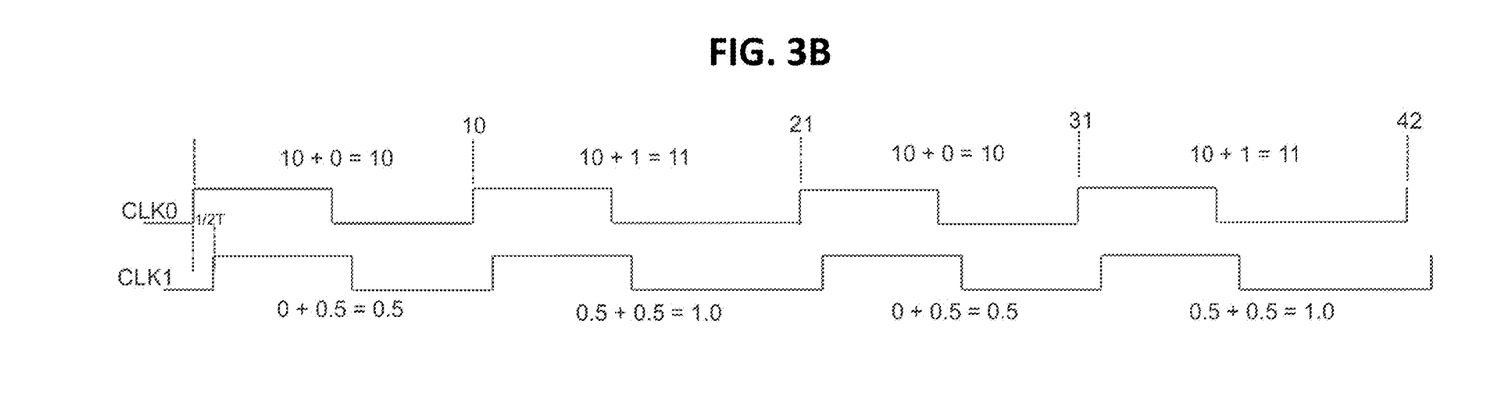
FIG. 3B is a timing diagram incorporating the logic and table of FIGS. 2B and 2C, respectively.

FIG. 3B is a timing diagram incorporating the logic and table of FIGS. 2B and 2C, respectively. In an embodiment, FIG. 3B depicts the summing performed by the summers 310 and 315. For example, for the first clock cycle, (i) the summer 310 sums the previous value at flop 322, which is preset at "0," with the value at the divide code bit 163 (i.e., "0+0.5=0.5") and (ii) the summer 315 sums the value at the divide code bit 163 with the carry value at the flop 321 (i.e., "10+0=10"). Therefore, for the first clock cycle, the period will be "10" and the clock cycle will be delayed by half of a period of the input clock 141. In other words, CLK1 will be selected. For the second clock cycle, (i) the summer 310 sums the previous value at flop 322 with the value at the divide code bit 163 (i.e., "0.5+0.5=1") and (ii) the summer 315 sums the value at the divide code bit 163 with the carry value at the flop 321 (i.e., "10+1=10"). Therefore, for the second clock cycle, the period will be "11" and the clock cycle will not be delayed by half of a period of the input clock 141. In other words, CLK0 will be selected. As depicted in FIG. 3B, a similar pattern follows for the third and fourth clock cycles. Specifically, the control logic selects CLK1 to land on the divide times including a "0.5" (i.e., "10.5" and "31.5") and selects CLK0 to land on divide times associated with an integer value (i.e., "21" and "42"). Further, the timing diagram also depicts that the integer portion (i.e., the divide code bits 262) of the programmable divider 250 is increased to "11" for the divide times of "21" and "42" in order to ensure that the correct frequency is maintained for the output clock 251.

Figure 3C:
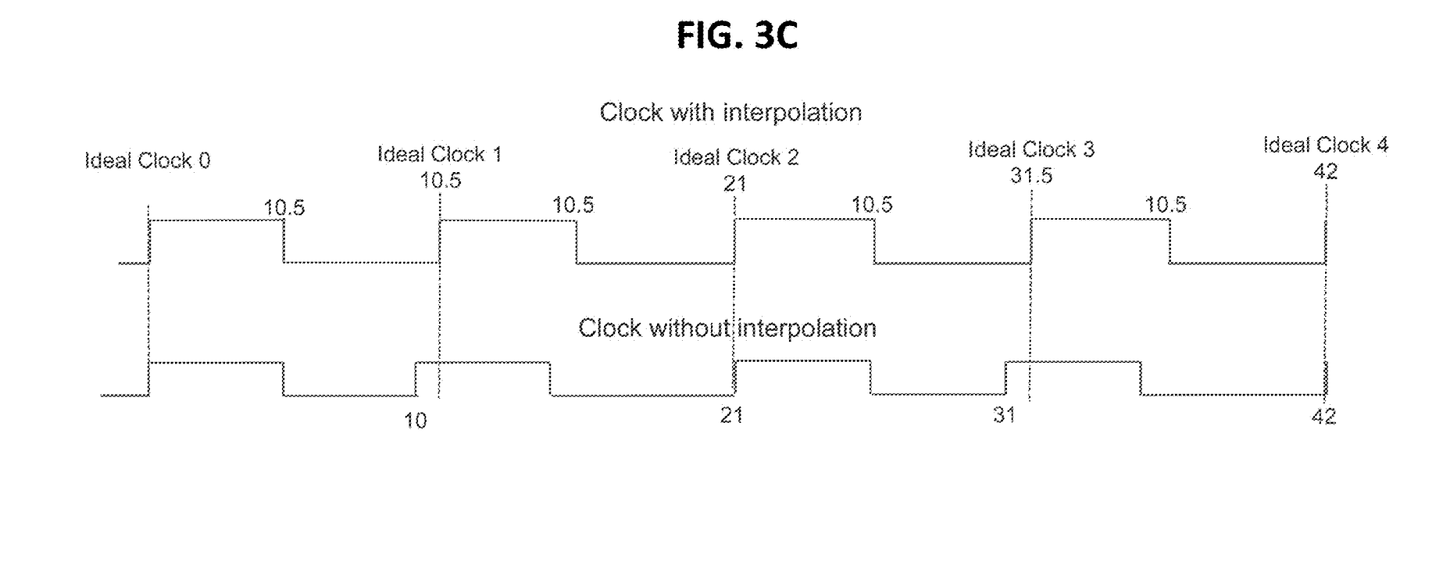
FIG. 3C is a timing diagram comparing the output clock of the fractional feedback divider with and without interpolation.

FIG. 3C is a timing diagram comparing the output clock of the fractional feedback divider with and without interpolation. As depicted in the figure, utilizing the interpolation technique discussed above (i.e., the control logic in conjunction with the programmable divider 250, the mux 280 and the delay elements 271 and 272), the programmable divider 250 is able to generate an output clock 251 that lines up correctly in phase with each clock cycle of an ideal clock. As further depicted in the figure, this is an improvement over the clock without interpolation, which is off from the ideal clock edge by half of a period of the input clock 141 every other cycle (e.g., cycles 1, 3, etc.). Further, in an embodiment, if the input fraction (i.e., divide code bit 163) was something other than "0.5," both clocks (i.e., with and without interpolation) would exhibit jitter. However, unlike the clock without interpolation, which would land within a period (i.e., of the input clock 141) of the ideal clock position, the interpolated clock edge would always land within half of a period (i.e., of the input clock 141) of the ideal clock position. Therefore, the clock with interpolation would still have 2× less jitter than the clock without interpolation.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

What is claimed is:

1. A fractional feedback divider circuit, the circuit comprising:
    a programmable feedback divider, the programmable feedback divider configured to receive a divide code value and an input clock signal, and generate a divided clock based on the divide code value and the input clock signal;
    first and second delay elements, wherein:
        the first delay element is configured to receive the divided clock and generate a first output clock signal,
        the second delay element is configured to receive the first output clock signal and generate a second output clock signal,
        the first delay element is clocked at a positive edge of the input clock signal and the second delay element is clocked at a negative edge of the input clock signal; and
    a multiplexer, the multiplexer having: a first multiplexer input configured to receive the first output clock signal, a second multiplexer input configured to receive the second output clock signal, and a third multiplexer input configured to receive a selector signal,
    wherein, based on the selector signal, the multiplexer outputs one of the first and second output clock signals.

2. The circuit of claim 1, wherein the divide code value corresponds to an integer portion of a desired divide ratio and the selector signal corresponds to a fractional portion of the desired divide ratio.

3. The circuit of claim 2, wherein (i) if the selector signal is associated with a fractional value, the second output clock signal is output and (ii) if the selector signal is not associated with the fractional value, the first output clock signal is output.

4. The circuit of claim 2, wherein the divide code value and the selector signal are adjustable.

5. The circuit of claim 4, wherein the divide code value and the selector signal are adjusted with control logic, the control logic comprising:
    a first summer, the first summer configured to: (i) sum the fractional portion of the desired divide ratio and a previous value at a first flop, (ii) update the first flop with a value equivalent to the sum of the fractional portion of the desired divide ratio and the previous value at the first flop, and (iii) update a second flop with a carry value from the sum of the of fractional portion of the desired divide ratio and the previous value at the first flop; and
    a second summer, the second summer configured to: (i) sum the integer portion of the desired divide ratio with the carry value at the second flop, (ii) update the divide code value with the sum of the integer portion of the desired divide ratio and the carry value at the second flop, and (iii) update the selector signal with the updated value at the first flop.

6. The circuit of claim 1, wherein the second output clock signal is delayed from the first output clock signal by half of a period of the input clock signal.

7. The circuit of claim 1, wherein the input clock signal is generated by a voltage controlled oscillator.

8. The circuit of claim 1, wherein one of the first output clock signal and the second output clock signal is output to a phase frequency detector.

9. A method for a fractional feedback divider circuit, the method comprising:
    receiving, at a programmable feedback divider, a divide code value and an input clock signal;
    generating, with the programmable feedback divider, a divided clock based on the divide code value and the input clock signal;
    receiving, at a first delay element, the divided clock, wherein the first delay element is clocked at a positive edge of the input clock signal;
    generating, with the first delay element, a first output clock signal;
    receiving, at a second delay element, the first output clock signal, wherein the second delay element is clocked at a negative edge of the input clock signal;
    generating, with the second delay element, a second output clock signal;
    receiving, at first, second and third multiplexer inputs of a multiplexer, the first output clock signal, the second output clock signal, and a selector signal, respectively; and
    outputting, based on the selector signal, one of the first and second output clock signals.

10. The method of claim 9, wherein the divide code value corresponds to an integer portion of a desired divide ratio and the selector signal corresponds to a fractional portion of the desired divide ratio.

11. The method of claim 10, wherein (i) if the selector signal is associated with a fractional value, the second output clock signal is output and (ii) if the selector signal is not associated with the fractional value, the first output clock signal is output.

12. The method of claim 10, wherein the divide code value and the selector signal are adjustable.

13. The method of claim 12, wherein the divide code value and the selector signal are adjusted with control logic, the control logic comprising:
    summing, with a first summer, the fractional portion of the desired divide ratio and a previous value at a first flop;
    updating, with the first summer, the first flop with a value equivalent to the sum of the fractional portion of the desired divide ratio and the previous value at the first flop;
    updating, with the first summer, a second flop with a carry value from the sum of the of fractional portion of the desired divide ratio and the previous value at the first flop;
    summing, with a second summer, the integer portion of the desired divide ratio with the carry value at the second flop;
    updating, with the second summer, the divide code value with the sum of the integer portion of the desired divide ratio and the carry value at the second flop; and
    updating, with the second summer, the selector signal with the updated value at the first flop.

14. The method of claim 9, wherein the second output clock signal is delayed from the first output clock signal by half of a period of the input clock signal.

15. The method of claim 9, wherein the input clock signal is generated by a voltage controlled oscillator.

16. The method of claim 9, wherein one of the first output clock signal and the second output clock signal is output to a phase frequency detector.

* * * * *